Sept. 17, 1957 G. E. CARTER, JR 2,806,977

MICROWAVE OSCILLATOR TUNING STRUCTURE

Filed Jan. 16, 1957 2 Sheets-Sheet 1

INVENTOR.

GEORGE E. CARTER, JR.

BY Edgar O. Rost

ATTORNEY

Sept. 17, 1957 G. E. CARTER, JR 2,806,977

MICROWAVE OSCILLATOR TUNING STRUCTURE

Filed Jan. 16, 1957 2 Sheets-Sheet 2

INVENTOR.
GEORGE E. CARTER, JR.
BY Edgar O. Rost
ATTORNEY

United States Patent Office 2,806,977

Patented Sept. 17, 1957

2,806,977

MICROWAVE OSCILLATOR TUNING STRUCTURE

George E. Carter, Jr., Danvers, Mass., assignor to Bomac Laboratories Inc., Beverly, Mass., a corporation of Massachusetts Application January 16, 1957, Serial No. 634,557

4 Claims. (Cl. 315—5.21)

The present invention relates to microwave oscillators and more particularly to such devices of the reflex klystron type having an external stabilizing cavity provided with a tuning plunger to facilitate precision tuning of the oscillator over a selected frequency band.

The reflex klystron oscillator is a high frequency single-resonator device employing the principles of velocity modulation and bunching for the purpose of production of radio frequency power. Such devices have been developed in the prior art with either integral or external resonant cavities. Tuning over the frequency band may be accomplished by varying the length of the radio frequency gap thereby adjusting the capacitive portion of the resonant cavity. Another mechanical tuning method involves variance of the inductive portion of the resonant cavity by means of screws or plugs extending through the cavity walls.

A technique of recent origin has been to stabilize microwave oscillators by means of very high Q external cavities coupled directly to the klystron with a section of connecting waveguide incorporated therebetween. Coupled external stabilization cavities have greatly reduced frequency shift caused by temperature changes. In addition a relatively small displacement of a tuning mechanism within the stabilizing cavity permits tuning of the klystron without the disadvantages inherent in mechanical tuning mechanisms of the capacitive and inductive type. Generally such stabilization cavities incorporate a straight-forward tuning screw arrangement which necessitates elaborate testing equipment to arrive at accurate frequency settings.

The present invention, therefore, has for its primary object the provision of an improved tuning mechanism for a stabilization cavity coupled to a reflex-klystron oscillator.

Another object is to provide a tuning mechanism in an external cavity tuned oscillator device to permit precise frequency settings over a selected band of frequencies.

A still further object is to provide a detent tuning mechanism in an external cavity tuned oscillator device incorporating features of temperature compensation and frequency stability at a plurality of predetermined frequency settings within a wide range of microwave frequencies.

Briefly, the preferred embodiment of the invention comprises a plurality of adjustable members mounted radially in a rotatable member positioned by a suitable structure secured to the external stabilization cavity. Each adjustable member contacts a tuning plunger in succession upon rotation of the rotatable member. By altering the dimensions of the adjustable members to a plurality of predetermined settings, progressive depression of the tuning plunger is realized. Further, since the adjustable member settings may be permanently secured within the rotatable member, accurate positioning of the tuning plunger is assured.

Other objects, features and advantages will be evident after consideration of the following detailed description and reference to the accompanying drawings, in which.

Figure 1:
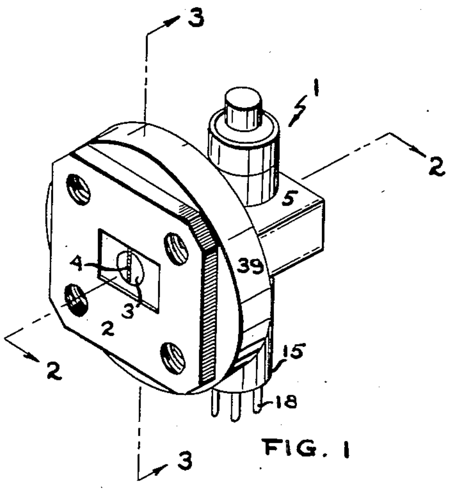
Fig. 1 is a perspective view of the illustrative embodiment.

Referring to Fig. 1 the embodiment of the invention shown comprises a reflex klystron 1 having a mounting flange 2 with a central coupling iris 3 and adjustable load matching screw 4 extending into the iris. The tube 1 is shown in detail in Fig. 2 and is of conventional construction. Cavity body member 5 has secured at opposite ends thereof an upper and a lower cylindrical member 6 and 7. Reflector electrode 8 is positioned by means of rod 9 secured to a reentrant metallic cup 10 by a glass-to-metal seal 11. Cup 10 in turn is secured to upper cylinder 6. A terminal cap 12 at the outer end of rod 9 provides external means for electrical connection to the reflector electrode.

The cathode gun assembly 13 is disposed within the lower cylinder 7 by means of stem assembly 14 and base 15. Beaded leads 16 secured to tabs 17 provide for support of the gun assembly as well as conduction of electrical current to the heater, cathode and getter in the manner well-known in the art. Pins 18 in base 15 are utilized for external circuit connections.

Grid support 19 secured to collar 20 has disposed at the ends thereof an accelerating grid 21 and intermediate grid 22 which is positioned within the body integral resonant cavity 23. The upper grid 24 encloses the inner end of upper cylindrical member 6 to complete the plural grid structure cooperating with the cathode and collector electrodes to provide for velocity modulation in the illustrative device. Exhaust tabulation 25 is secured to body member 5 to evacuate the overall tube assembly.

Output waveguide section 26 of the configuration shown interconnects the tube integral resonant cavity 23 with the external stabilizing cavity 27. A transparent window 28, generally but not limited to such materials as optically flat mica, is hermetically sealed across one end of waveguide section 26 to preserve the vacuum condition of the tube.

It has been observed in the art that when the klystron and stabilizing cavity are tuned to the same frequency, there exist several possible frequencies of oscillation as a result of the presence of the section of transmission line connecting the two resonant cavities. By means of mode suppressors the undesired frequencies have been eliminated so that oscillation takes place only at the resonant frequency. For this reason two pins are introduced through the side walls of section 26 a predetermined dimension and locked in position. The tip 29 of one of these pins is visible as indicated. An adjustable screw and locknut arrangement 30 is positioned in the top wall of section 26 and may be considered as a phasing screw in the suppression of the undesired frequencies.

The external stabilizing cavity 27 is secured as by brazing or soldering to waveguide section 26 and it is this component of the complete tube assembly which incorporates my improved tuning mechanism for altering the admittance of the external cavity by varying the positioning of a probe therein. A cyclindrical bearing member 31 having a rectangular central aperture to conform to the configuration of the external cavity is positioned to encircle the external cavity walls and may be permanently secured thereto. An axial aperture extends through the top wall of the external cavity and bottom of the member 31 to permit vertical displacement of tuning plunger 32 within the cavity. The upper end of bearing member 31 is provided with flanged wall structure 33 and 34 to define a cylindrical groove. An open-ended chamber 35 is defined within one segment of the bearing member 31 to house the plunger actuating mechanism.

Figure 3:
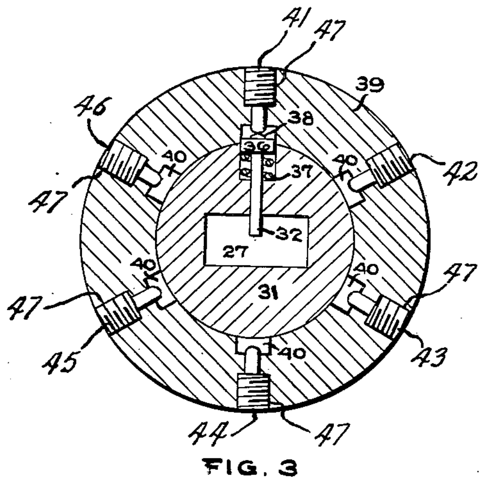
Fig. 3 is a detailed cross-sectional view taken along the line 3—3 in Fig. 1.
Figure 2:
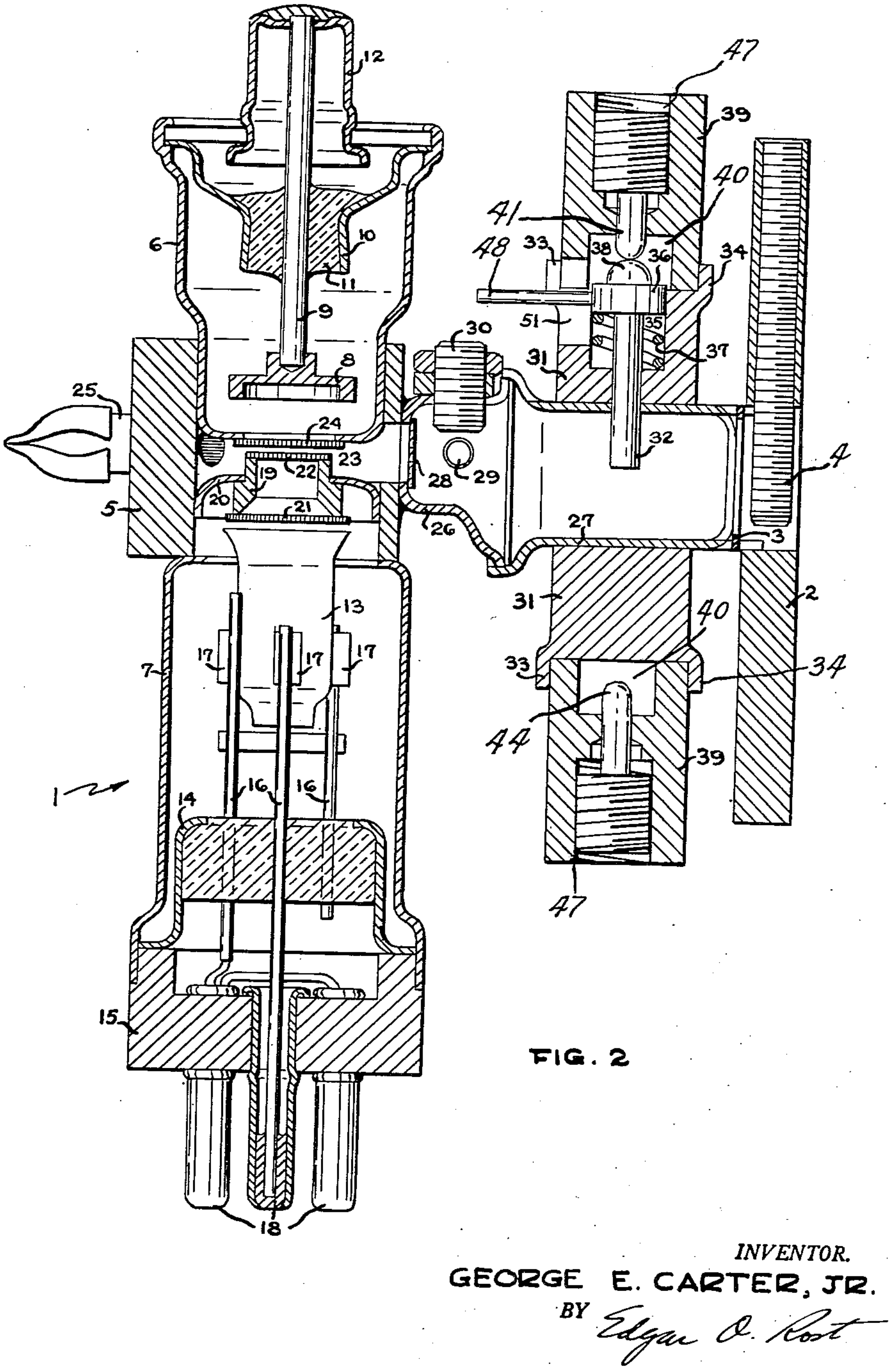
Fig. 2 is a detailed cross-sectional view taken along the line 2—2 in Fig. 1.

Referring now to Fig. 3 as well as Fig. 2, tuning plunger 32 has secured thereto a substantially piston-like section 36 dimensioned to be slidably disposed within chamber 35. Spring 37 provides sufficient resiliency to urge the piston section 36 upwards to withdraw plunger 32 from the cavity. A dome-like projection 38 is centrally disposed on the top wall of piston 36 to contact a plurality of adjustable tuning members in the manner now to be described.

A rotatable member 39 is mounted within the cylindrical groove defined by walls 33 and 34. A plurality of open-ended chambers 40 are radially disposed along the inside edge of member 39 where it abuts bearing 31. Each chamber is dimensioned to register with chamber 35 in each of the tuned positions. A plurality of adjustable tuning members 41—46 are radially disposed within rotatable member 39 with the inner ends thereof extending into chambers 40. In the illustrative embodiment the tuning members are threaded into the rotatable member and may be securely positioned after adjustment by means of the so-called "Heli-Coil" screw lock inserts 47 which are available commercially. These inserts comprise a plurality of circular coils to engage the threaded members with a grip coil intermediately disposed of a hexagonal or polygonal shape. As the grip coil is forced to conform to the screw thread a strong spring-like pressure is exerted which produces the locking effect.

In accordance with the teachings of the present invention each adjustable tuning member is successively set to a dimension which progressively alters the displacement of tuning plunger 32 thereby varying the frequency of the tube. Once the various settings have been determined and adjustable tuning members locked in position subsequent accurate settings are assured. It will be noted that the dome projection 38 of piston 36 contacts the tips of members 41—46 in each of the tuned positions. To rotate member 39 to the various frequency settings the embodiment shown in Figs. 2 and 3 has a lever 48 extending from piston 36 through a vertical slot 51 in wall 33 of member 31 as well as rotatable member 39. As lever 48 is depressed the piston 36 will be wholly contained within chamber 35 and thereby free rotatable member 39 for rotation to the desired position, say for example the next tuning member 42 in the illustration. After rotation, the lever may be released and piston 36 will enter chamber 40 containing screw 42 thereby preventing any further rotation. Upon engagement of screw 42, the plunger 32 will be inserted an increased distance corresponding to the difference between the settings of tuning members 42 and 41.

Figure 4:
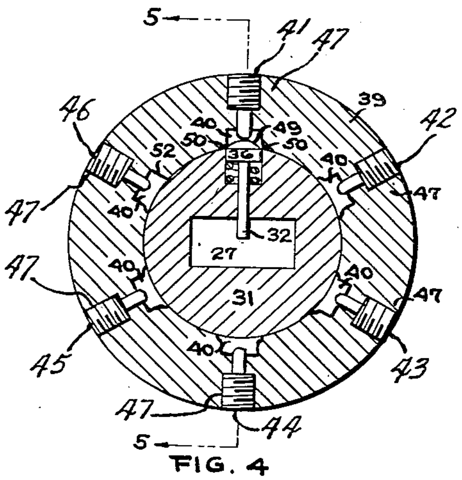
Fig. 4 is a cross-sectional view of an alternative embodiment of the tuning mechanism of the invention.
Figure 5:
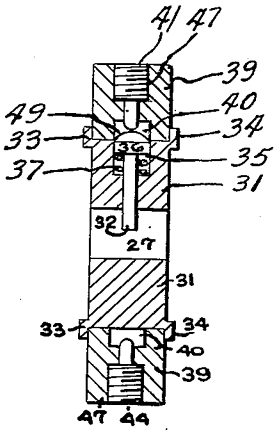
Fig. 5 is a cross-sectional view taken along the line 5—5 in Fig. 4.

In Figs. 4 and 5 an alternative embodiment is illustrated which eliminated any need for manipulation of a lever in moving from one position to the next. Piston 36 in this instance has an arcuate top wall 49 which engages the tips of tuning members 41—46. Chambers 40 are provided with a concave taper 50 on the corners abutting bearing 31. With this configuration a slight pressure upon rotatable member 39 will cause the piston wall 49 to ride over the taper 50 thereby depressing the piston until it is enclosed with chamber 35. Upon approaching the next stop or position a similar taper permits upward movement of the piston to engage the next tuning member. Since it may be undesirable to move from the longest adjustable tuning member 46 to the shortest 41 due to possible damage to the contacting surfaces, a structure to prevent further clockwise motion would comprise a non-tapered straight chamber wall 52. Rotatable member 39 may then be rotated counter-clockwise to the desired frequency settings. Other movement-limiting structures common to the art may of course be incorporated if desired.

To complete the overall tube structure, coupling iris 3 is sealed across the output side of the cavity 27 and a flange 2 to connect to waveguide structure is secured to the external cavity walls. In order to match the tube assembly to the impedances of the waveguide load, a screw 4 is introduced vertically through flange 2 with the end thereof centrally disposed within the iris.

Materials chosen for the overall tuning structure as well as the external stabilizing cavity may be selected to incorporate such features as temperature compensation and stability in accordance with prior art knowledge.

There is thus disclosed an improved tuning structure which provides accurate reproducible frequency settings over a predetermined frequency range. Furthermore, it is possible to change the desired frequency settings simply by adjustment of the tuning members.

While a specific embodiment has been described, numerous modifications may occur to those skilled in the art. It is my intention therefore, to cover in the appended claims such modifications as fall within the spirit and scope of the invention.

What is claimed is:

1. The combination of a microwave oscillator of the reflex-klystron type having an external stabilizing resonant cavity coupled thereto and tuning means cooperating with said resonant cavity to vary the oscillator frequency, said tuning means comprising a fixed member secured to and encircling the walls of said external resonant cavity, said fixed member defining a groove in the outer peripheral walls thereof, a tuning plunger housed within a chamber defined in said fixed member, said tuning plunger having an end thereof extending into said resonant cavity, a rotatable member positioned within said fixed member groove, said rotatable member defining a plurality of open-ended chambers in the wall surface adjacent to said fixed member groove, a plurality of adjustable tuning members radially disposed within said rotatable member with the ends of each tuning member extending a varying distance into said open-ended chambers, said tuning plunger moving upwardly into each of said open-ended chambers to engage said adjustable tuning members upon rotation of said rotatable member to a plurality of predetermined positions to thereby vary the depth of insertion of said tuning plunger within said resonant cavity.

2. The combination of a microwave oscillator of the reflex-klystron type having an external stabilizing resonant cavity coupled thereto and tuning means cooperating with said resonant cavity to vary the oscillator frequency, said tuning means comprising a bearing member mounted on the external walls of said resonant cavity, said bearing member defining a groove in the outer peripheral walls thereof, said bearing member further defining an open-ended chamber dimensioned to house a tuning plunger therein, said tuning plunger having one end extending into said resonant cavity, a resilient member positioned within said bearing chamber to move said tuning plunger in an upward direction, a rotatable member positioned within said bearing member groove, said rotatable member defining a plurality of radially disposed open-ended chambers in the wall surface abutting said bearing member, each of said chambers being dimensioned to be in register with said bearing member chamber in a plurality of predetermined positions, a plurality of adjustable tuning members extending radially into said rotatable member with the ends thereof positioned within said rotatable member chambers, each of said tuning members extending into said chambers a varying distance, said tuning plunger contacting said tuning members upon rotation of said rotatable member to a position wherein each of said radially disposed chambers are in register with said bearing member chamber.

3. The combination of a microwave oscillator of the reflex-klystron type having an external stabilizing resonant cavity coupled thereto and tuning means cooperating with said resonant cavity to vary the oscillator frequency, said tuning means comprising a cylindrical bearing member mounted on and encircling the walls of said external resonant cavity, said bearing member defining a cylindrical groove in the outer peripheral walls thereof, said bearing member further defining an open-ended chamber, a piston member housed within said chamber with a conductive rod disposed from the underside thereof, said conductive rod extending through said bearing member into said resonant cavity, resilient spring means within said bearing chamber to move said piston member in an upward direction, a cylindrical rotatable member positioned within said bearing member groove, said rotatable member defining a plurality of radially disposed open-ended chambers in the wall surface abutting said bearing member groove, each of said chambers being dimensioned to receive said piston member when said rotatable member is rotated to a plurality of positions in register with said bearing member chamber, a plurality of adjustable screw members each extending a predetermined distance into said rotatable member chambers, said piston member contacting each of said screw members in a plurality of positions to thereby axially move said conductive rod within said resonant cavity and alter the tuned frequency of said oscillator.

4. The combination as claimed in claim 3 wherein said piston member is provided with a dome-like projection on the wall surface contacting said adjustable screw members.

References Cited in the file of this patent

UNITED STATES PATENTS 2,789,250 Varian et al. ............ Apr. 16, 1957